United States Patent [19]

Iafrate et al.

[11] Patent Number: 4,667,211
[45] Date of Patent: May 19, 1987

[54] MILLIMETER WAVE-INFRARED BLOCH OSCILLATOR/DETECTOR

[75] Inventors: Gerald J. Iafrate, Toms River; Roger J. Malik, Little Silver; Thomas Au Coin, Ocean, all of N.J.

[73] Assignee: The United States of America as represented by the Secretary of the Army, Washington, D.C.

[21] Appl. No.: 772,971

[22] Filed: Sep. 5, 1985

[51] Int. Cl.[4] .............................................. H01L 27/12
[52] U.S. Cl. ............................................ 357/4; 357/58
[58] Field of Search ........................... 357/58, 4, 4 SL

[56] References Cited

U.S. PATENT DOCUMENTS 4,410,902 10/1983 Malik .
4,442,445 4/1984 Malik et al. ............................ 357/58
4,539,581 9/1985 Malik et al. .

OTHER PUBLICATIONS

*Physical Review Letters,* 19 Aug. 1974, vol. 33, No. 8, pp. 495–498, L. Esaki, "New Transport . . . Superlattice" Discloses Superlattice, *J. Vac. Sci. Technol.,* Sep./Oct., 1973, vol. 10, No. 5, p. 655, Structures Grown by Molecular Beam Epitaxy, L. L. Chang.

*Superlattices and Microstructures,* vol. 1, No. 2, 1985, published Sep. 1984, "On the Existence . . . Superlattices" discusses Bloch Oscillations, R. Grondin, et al.

*Primary Examiner*—Martin H. Edlow
*Attorney, Agent, or Firm*—Sheldon Kanars; Jeremiah G. Murray; John T. Rehberg

[57] ABSTRACT

An electronic oscillator being operable to detect millimeter wave and infrared frequency output signals over the range of 1–1000 GHz consists of a semiconductor device having a structure comprised of a first planar doped barrier region separated from a second planar doped barrier region by a superlattice region. Upon the application of a uniform electric field, the first planar doped barrier region operates as a means for injecting electrons into the superlattice region which then traverse to the second planar doped barrier region which operates as means for receiving the electrons. During transit through the superlattice region, the electrons undergo an oscillatory motion thereby making possible the detection of signals whose frequency is a function of the applied voltage and the periodic spacing of the superlattice.

13 Claims, 4 Drawing Figures

MILLIMETER WAVE-INFRARED BLOCH OSCILLATOR/DETECTOR

The invention described herein may be manufactured, used snd licensed by or for the Government for governmental purposes without the payment of any royalties thereon or therefor.

FIELD OF THE INVENTION

This invention relates generally to semiconductive devices and more particularly to planar doped barrier and superlattice devices.

DESCRIPTION OF THE PRIOR ART

Semiconductor structures taking the form of planar doped barrier and superlattice devices are well known. A planar doped barrier device is disclosed, for axample, in U.S. Pat. No. 4,410,902, entitled, "Planar Doped Barrier Semiconductor Device", which issued to Roger J. Malik, one of the present inventors, on Oct. 18, 1983. Disclosed in that patent is a majority carrier rectifying barrier semiconductor device fabricated in gallium arsenide (GaAs) by an epitaxial growth process which results in an n+-i-p+-i-n+ semiconductor structure wherein an extremely narrow p+ planar doped region is positioned between adjoining regions of nominally undoped or intrinsic i semiconductor material. The narrow widths of the undoped regions and the high densities of the ionized impurities within the space charge region results in a rectangular electric field and triangular potential barrier respectively. Independent and continuous control of the barrier height and its effect on the asymmetry of the current vs. voltage characteristic is provided through variation of the acceptor charge density in the undoped region widths. In operation, majority carrier thermionic traneport occurs across the planar doped barrier defined by the p+ planar doped region and the two adjoining undoped regions upon the application of a bias voltage across the n+ outer regions.

With respect to the structure of a superlattice, this type of device is disclosed, for example, in an article entitled, "New Transport Phenomenon In A Semiconductor Superlattice", by L. Esaki, et al. in *Physical Review Letters*, Aug. 19, 1974, Volume 33, Number 8, pp. 495–498. There a GaAs-GaAlAs periodic structure, known as a superlattice, is disclosed having extremely narrow potential barriers and wells which at certain fields exhibits an oscillatory behavior with respect to applied voltages. The periodic structure of superlattice furthermore is known to be fabricated by the proceas known as molecular beam epitaxy (MBE) which comprises a semiconductor growth technique which involves the use of selected molecular beams for oondensation on a heated substrate in ultra-high vacuum environment. This process has ben disclosed, for example, in a publication entitled, "Structures Grown By Molecular Beam Epitaxy", L. L. Chang, et al., *J. Vac. Sci. Technol.*, Vol. 10, No. 5, Septembar/October, 1973, page 655. Due to the relatively slow growth rate and low substrate temperature, very preoise epilayer thicknesses and abrupt doped profiles can be obtained.

In a known co-pending application, identified Ser. No. 300,406, entitled, "Planar Doped Barrier Transistor", and filed in the names of Roger J. Malik, et al. on Sept. 8, 1981, there is disclosed a three terminal epilayer semiconductor structure forming a transistor comprised of two rectifying planar doped barriers separated by an intermediate semiconductor region, with the two barriers having respective predetarmined barrier height characteristics which are altered upon application of a bias potential thereacross and with the intermediate region providing a region for the controlled injection and collection of electrons from one of the barriers whereby majority carriers, i.e. electrons, will surmount and be swept across the other barrier when the peak of the other barrier is below peak of the first barrier as a result of the applied bias. The device is furthermore fabricated by an epitaxial growth process such as molecular beam epitaxy which results in an n+-i-p+-i-n+ structure forming the first outer barrier while the other or underlining barrier comprises an n+-i-p+-i- n+ structure with the intermediate region consisting of a portion of the n+ layer to both barriers. The composite structure, moreover, utilizes interdigited ohmic contacts for two of the terminals defining the emitter and base contact of the transistor to minimize the series resistances and capacitances associated with the device.

In another known co-pending application, identified as U.S. Ser. No 397,340, entitled, "Planar Doped Barrier Transferred Electron Oscillator", and filed in the name of Roger J. Malik, et al. on July 12, 1982, there is disclosed a transferred electron semiconductive device formed by an epitaxial growth process in gallium arsenide (GaAs), for example, and which comprises a body or substrate of semiconductive material on which is formed a drift region of semiconductor material having a doping density in a dimension selected to provide, upon the application of a biasing potential exceeding a predetermined threshold, a differential negative resistance due to the transferred electron effect and electron injecting means consisting of a planar doped barrier region adjacant the drift region providing precise field potential profiles for controlling the injection of electrons into the drift region. Metallized ohmic contacts are applied on the outer surface of the substrate and the surface of the outermost layer of the planar doped barrier region for the application of energizing potentials.

The phenomenon of Bloch oscillations discussed in the present application is also discussed in the article "On the Existence and Detection of Bloch Oscillations in Superlattices," by R. Grondin et al., in Superlattices and Microstructures, vol. 1, No. 2, 1985, published September 1984. This article discloses the phase modulation aspects of Bloch oscillations in superlattices.

Accordingly, it is an object of the present invention to provide improvement in semiconductor devices.

Another object of the present invention is to provide an improvement in semiconductor devices incorporating a planar doped barrier.

Still another object of the present invention is to provide an improvement in semiconductor devices incorporating a superlattice.

And yet another object of the invention is to provide a semiconductor device which is operable at millimeter wave and infrared frequencies.

And yet another object of the invention is to provide a semiconductor oscillator which is oparable in the GHz frequency range.

SUMMARY

Briefly, the foregoing and other objects are achieved by means of a semiconductor device comprised of first and second planar doped barrier regions acting as injector and receptor means, respectively, for majority carriers, i.e. electrons, and being separated by an intermediate region consisting of a superlattice drift region. The injector and receptor barriar regions have respective predetermined height characteristics which are alterable with the application of a bias potential. Upon application of a bias potential across the device, majority carriers from one of the barrier regions will be swept across the superlattice region to the other barrier region. The electrons traversing the superlattice region undergo an oscillatory motion and in doing so give rise to signals at a frequency corresponding to an angular frequency known as the Bloch frequency. In a first embodiment metallized contacts are applied to the two outermost regions to provide a diode structure while in a second embodiment the lowermost region is extended outwardly on either side of the superlattice drift region with a ring-shaped metallized contact being applied thereto to provide a diode-type structure.

BRIEF DESCRIPTION OF THE DRAWINGS

While the present invention is defined in the claims annexed to and forming a part of this specification, a better understanding can be had by reference to the following description when taken in conjunction with the accompanying drawings in which:

DESCRIPTION OF THE PREFERRED EMBODIMENT

In this invention, a new and improved mm-wave detector, tunable through 1–10000 GHz, is briefly described. The oscillator operation is based on the concept of "Bloch" oscillations, sometimes referred to as Zener oscillations, which arise from the solid state theoretical hypothesis that electrons traversing a period lattice potential in a solid, without scattering while under the influence of a uniform dc electric field, will oscillate with a frequency which is linear in the electric field strength and the lattice constant.

The single-band equations of motion for an electron traversing a periodic potential, without scattering, under the influence of an external electric field E are:

$$\hbar \vec{k} = e\vec{E}(t) \quad (1)$$

and $$\vec{v} = \frac{1}{\hbar} \vec{\nabla}_{\vec{k}} \epsilon(\vec{k}) \quad (2)$$

where $\hbar \vec{k}$ is the electron momentum in the solid, $\hbar$ being Planck's constant, e is the charge on the electron, $\vec{E}(t)$ is the external electric field, $\vec{v}$ is the electron velocity, and $\epsilon(\vec{k})$ is the electron energy band dispersion which is periodic with reciprocal lattice vectors.

Figure 2:
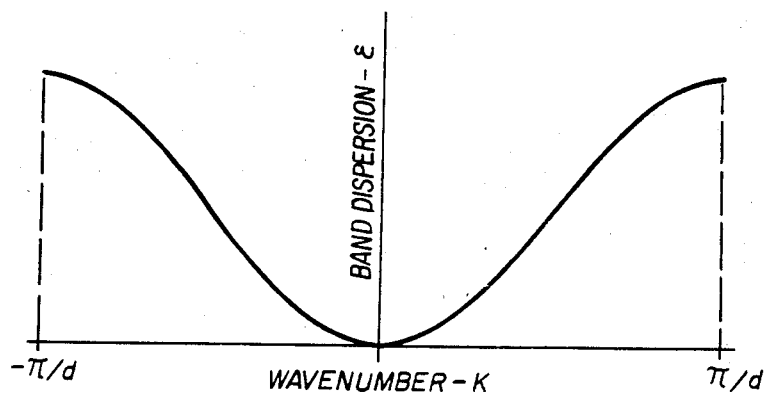
FIG. 2 is a diagram helpful in understanding the operation of the subject invention.

In the reduced scheme $\vec{k}$, the wave vector in one dimension, varies between $-\pi/d$ to $+\pi/d$ where d is the lattice spacing as shown in FIG. 2. While a one dimensional analysis is provided, for the sake of a simple explanation, it can when desirable be extended to a two or three dimensional analysis.

It is clear from equations (1) and (2) that if a constant electric field is applied across a structure with a periodic potential having lattice spacing d, then the electron momentum will increase linearly with time and the electron velocity will oscillate. Since $\epsilon$ is a function of $\vec{k}$, then $\vec{\nabla}_{\vec{k}} \epsilon(\vec{k})$ is periodic with the reciprocal lattice. The fundamental period $\tau$ of this oscillation, the so-called "Bloch" oscillation, is derived by integrating equation (1) with $E=E_O$, i.e. constant electric field, over the entire first Brillouin zone from which one obtains the expression:

$$\tau = 2\pi \hbar /eE_o d \quad (3)$$

In terms of angular frequency $\hbar \omega_B$ where $\omega_B$ refers to the "Bloch" frequency, it can be expressed as:

$$\hbar \omega_B = eE_o d \quad (4)$$

Accordingly, for lattice d spacings of ten angstroms (10A), the "Bloch" frequency will range from about ten to one hundred gigahertz (10–1000 Ghz) with respective field variations of one to ten kilovolts per centimeter (1–10 kV/cm); likewise, for lattice d spacings of one hundred angstroms, the "Bloch" frequency will range from 10 GHz to 100 GHz for field variations of one hundred to one thousand volts per centimeter.

While the subject invention is not restricted to a fabrication process involving molecular beam epitaxy (MBE), such a process is nevertheless preferable due to the fact that very precise epilayer thicknesses and abrupt doping profiles can be obtained. When desirable, however, the structure may be fabricated by a process of chemical and vapor deposition well known to those skilled in the art. Furthermore, the structure to be described hereinafter can be fabricated using various types of Group III-V or II-IV semiconductor compounds, the preferred embodiment comprises a structure fabricated with gallium arsenide (GaAs). Higher Block frequencies are achievable with compounds which have larger band gaps.

Figure 1:
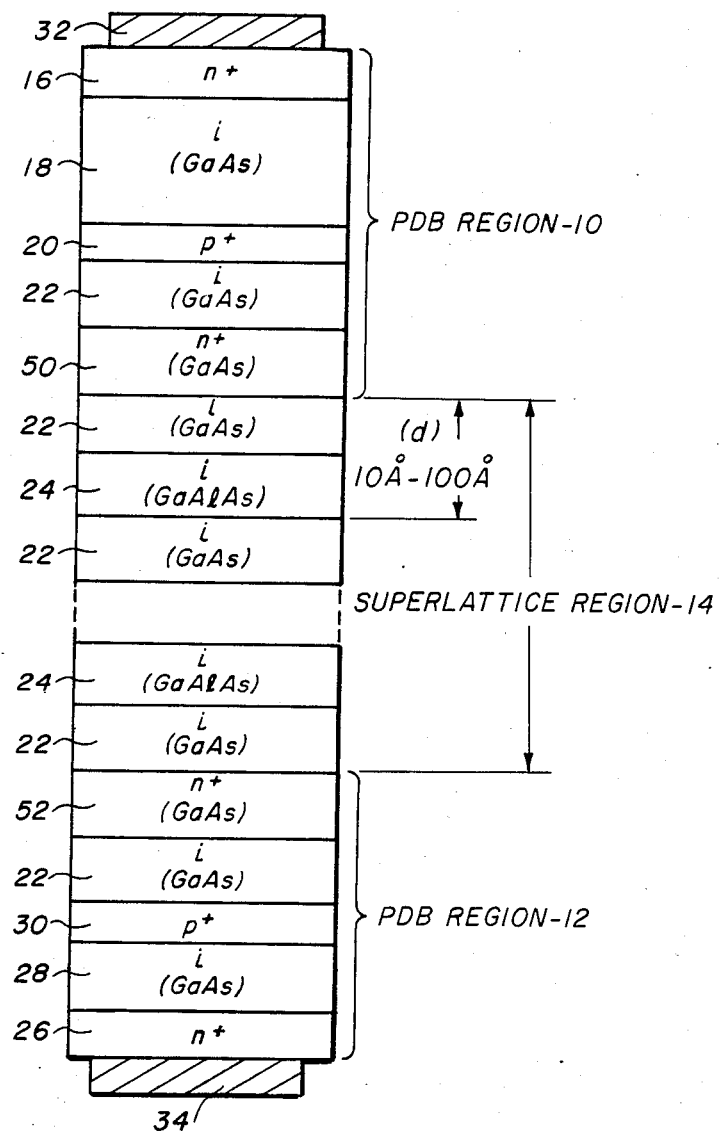
FIG. 1 is a cross sectional view schematically illustrative of a semiconductor diode structure in accordance with the subject invention.

Referring now to FIG. 1, shown therein is a two terminal device and more particularly a "Bloch" oscillator diode. More properly, it comprises an epilayer diode having a first or upper planar doped barriar GaAs region 10 separated from a second or lower planar doped barrier GaAs region 12 by a GaAs-GaAlAs superlattice region 14. The upper PDB region 10 which might be referred to as an anode or an injector region, comprises an n+-i-p+-i-n+ structure including an outer n+ doped layer of gallium arsenide 16, a substantially intrinsic or i layer of gallium arsenide 18, a p+ doped layer of gallium arsenide 20 and another i layer of gallium arsenide 22, and an inner n+ doped layer of gallium arsenide 50. The relatively narrow p+ planar region 20 accordingly defines an acceptor region while the oppositely doped n+ layers 16 and 50 constitutes donor regions.

The superlattica region comprises a region ranging between 100A and 1000A thereacross and including alternating layers of GaAs 22 and GaAlAs 24 of i semiconductor material and where each period of the superlattice comprises a pair of GaAs and GaAlAs layers 22 and 24 having a combined thicknees ranging between 10A and 100A. The lowermost layer may be GaAs 22, if desired. The lower PDB region 12 is comprised of an n+-i-p+-i-n+ gallium arsenide structure including another outermost n+ doped layer 26, an adjoining i layer 28, a second p+ doped layer 30, and an inner i layer 22 and an inner n+ doped layer of gallium arsenide 52. As in the upper PDB region 10, the n+ regions 26 and 52 comprises donor regions while the p+ region 30 comprises an acceptor region of the planar doped barrier region 12. Further as shown in FIG. 1, a pair of ohmic contacts 32 and 34 are formed on the outer surfaces of the two outermost n+ layers 16 and 26, respectively.

In order to demonstrate that a "no collision" regime can be established, it is known from transport studies that electrons in gallium arsenide at a temperature of 300° K. traverse a distance of 100A without suffering a scattering event which is a true ballistic motion. For distances larger than 100A, electrons suffer modest collision and in fact after 1000A of travel in electric fields of 10 KV/cm, only 50% of the electrons have suffered collision. This means that "Bloch" oscillations or at least negative differential resistance effects are achievable in GaAs-GaAlAs superlattice structures with lattice spacings on the order of 10A or more.

Accordingly, for a lattice spacing or period ranging from 10Å to 100Å, and for an applied electric field varying from $10^3 - 10^5$ volts per centimeter, one can obtain a tunable oscillator over a frequency range of 10 GHz–1000 GHz. The following Table I comprises a list of pertinent parameters illustrative of requirements for obtaining a particular oscillator frequency.

TABLE I

| d (Å) = | E (V/cm) | $\hbar\omega_R$ (meV) | $\omega_R$ (GHz) | $\tau_R$ ($10^{-12}$ sec) |
|---|---|---|---|---|
| 10 Å = | $10^3$ | 0.1 | 10 | 30 |
| $10^{-7}$ cm | $10^4$ | 1.0 | 100 | 3 |
|  | $10^5$ | 10.0 | 1000 | 0.3 |
| 100 Å = | $10^3$ | 1.0 | 100 | 3 |
| $10^{-6}$ cm | $10^4$ | 10.0 | 1000 | 0.3 |

Therefore, under a condition where a bias potential is applied across the PDB regions 10 and 12, the barrier of PDB region 10, for example, is reduced while the barrier of PDB region 12 is increased, whereupon a majority carrier (electron) injection takes place into the superlattice region 14. As the electrons surmount the peak of the injector barrier 10, they are quickly accelerated by the relatively high electric field across the suparlattice and traverse to the PDB receptor region 12.

Figure 3:
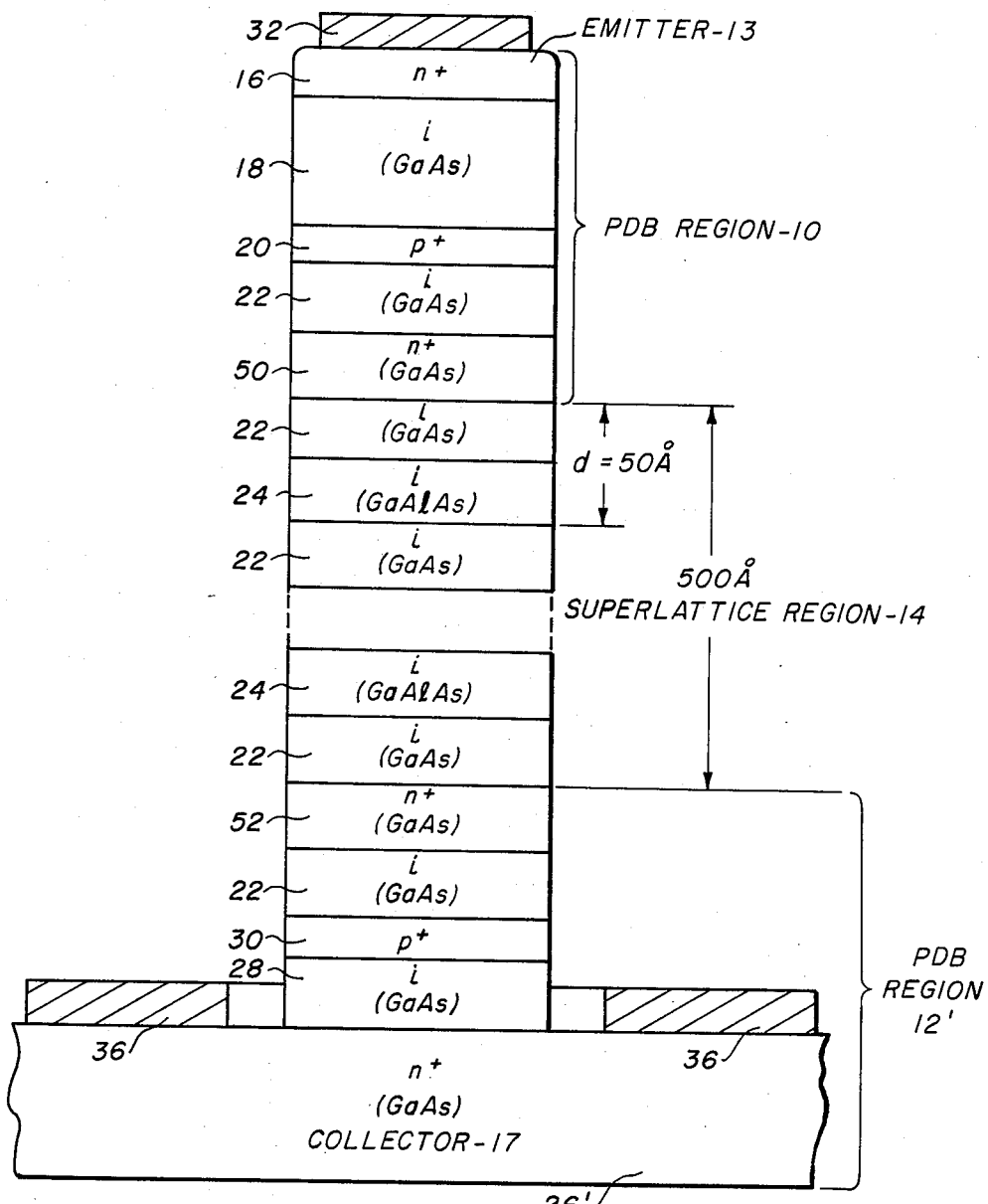
FIG. 3 is a partial cross sectional view schematically illustrative of a semiconductor structure in accordance with the subject invention.

Referring now to FIG. 3, a millimeter wave "Bloch" oscillator is shown. Such a device is particularly designed to detect mm-wave radiation by phass modulation methods. It comprises a structure similar to that disclosed with respect to FIG. 1 with the exception that the ohmic contact 34 on the undersurface of the n+ region 26 is deleted in favor of a widened and relatively thicker lowermost n+ region 2640 of GaAs which extends outwardly from either side of the location of the contiguous PDB region 10 and superlattice region 14. A lower PDB region 12' is thus provided which comprises the n+ layer 52, the i layer 22, the p+ layer 30, the i layer 28 and the n+ layer 26'.

Now, however, an ohmic contact ring 36 is applied to the upper surface of the n+ layer 26' and separated a predetermined distance from the superlattice structure. The resulting semiconductor structure comprises a mesa type of device wherein the ohmic contact ring 36 is connected to the collector 17 and the ohmic contact 32 is connected to the emitter 13. Furthermore, the superlattice spacing d is shown being equal to 50A while the superlattice region 14 spans 500A. With constant electric field being applied to the device as shown in FIG. 3, an energy band diagram will be generated such as shown in FIG. 4 and as electrons surmount the peak of the emitter barrier $O_{EB}$ they are quickly accelerated over a very short distance where they are ejected into superlattice region 14 where they encounter a periodic barrier followed by the collector barrier $O_{BC}$.

Figure 4:
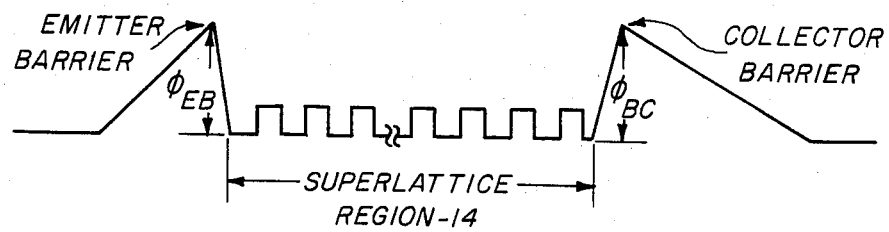
FIG. 4 is an energy band diagram for the structure shown in FIG. 3.

If both of the n+ epilayers 50 and 52 are omitted, the energy level of the superlattice region 14 in FIG. 4 is raised to equal the barrier heights $O_{EB}$ and $O_{BC}$ and the electrons are injected by thermionic emission.

If an alternating mm-wave field is superimposed across the superlattice region by being applied to the ohmic contact 32, there results a phase modulation of the electron velocity. When the constant electric field is adjusted so that the "Bloch" frequency is a multiple of the alternating mm-wave field frequency, a DC current is induced across the transistor whose magnitude reflects the power of the mm-wave radiation, providing thereby a mm-wave detector.

To demonstrate the phase modulation aspects of the "Bloch" oscillator, consider a single electron confined to a sinusoidal band $\epsilon(a)=E_0-E_1 \cos (ka)$ under the influence of both a DC external field $E_0$ and external RF field, $E_1 \cos (t)$. The solution to equations (1) and (2) is then expressed as:

$$k(t) = k_0 + \frac{eE_0}{\hbar} t + \frac{eE_1}{w} \sin wt \quad (5)$$

The corresponding velocity can then be expressed as:

$$v(t) = v_0 \sin\left( w_B t + k_0 d + \frac{w_B}{w} \frac{E_1}{E_0} \sin wt \right) \quad (6)$$

where $V_o=(E_1 a)/$ .

This expression can be rewritten then as:

$$\frac{v}{v_0} = \sum_{n=0}^{\infty} J_n(z)\{\sin(w_B + nw)t + (-1)^n \sin(w_B - nw)t\} \cos k_0 d + \sum_{n=0}^{\infty} J_n(z)\{\cos(w_B + nw)t + (-1)^n \cos(w_B - nw)t\} \sin k_0 d \quad (7)$$

where $Z=(E_1/E_0)(\omega/\omega_B)$ and $J_n(Z)$ is a Bessel function. A DC component occurs for $\omega_B=n\omega$. For a fixed $\omega$, the Bloch frequency, $\omega_B$, can be tuned by changing the DC field to satisfy the equation:

$$E_0 = n \hbar \omega/ed \quad (8)$$

Thus what has been shown and described is a hybrid planar doped barrier superlattice device which can produce millimeter wave signal oscillations over the frequency range of 1–1000 GHz with the attended advantage of high efficiency.

While the subject invention has been described with a certain degree of particularity, the foregong has been made by way of illustration and not limitation. Accordingly, all modifications, alterations, changes coming within the spirit and scope of the invention as set forth in the appended claims are herein meant to be included.

What is claimed is:

1. A semiconductor device being operable to produce millimeter wave signal oscillations, comprising in combination:

first and second planar doped barrier regions of semiconductor material separated by a superlattice region, said superlattice region being comprised of a plurality of pairs of alternating layers of semiconductor material wherein each pair of layers define a period of a superlattice, said first planar doped barrier region being comprised of a relatively narrow layer of first type semiconductivity located between a pair of nominally undoped or intrinsic layers, each of said intrinsic layers being bounded by an outer layer of second type semiconductivity, said second planar doped barrier region being comprised of a relatively narrow layer of first type semiconductivity located between a pair of nominally undoped or intrinsic layers, each of said other intrinsic layers being bound by an outer layer of second type semiconductivity, whereby upon the application of a uniform electric field, the first planar doped barrier region oparates to input majority carriers into said superlattice region and which traverse therethrough and are collected by said second planar doped barrier region and in so doing undergo an oscillatory motion which is a function of the magnitude of the applied potential and the distance across each period of said superlattice region.

2. The device as defined by claim 1 wherein said pairs of alternating layers of semiconductive material comprise intrinsic layers of semiconductivity.

3. The device as defined by claim 1 wherein said device is fabricated from semiconductor compounds selected from Group III-V or II-IV compounds as well as silicon.

4. The device as defined by claim 1 wherein said first and second planar doped barrier regions are formed from gallium arsenide and wherein said superlattice region is formed from alternating layers of gallium arsenide and gallium aluminum arsenide.

5. The device as defined by claim 1 wherein said first type of semiconductivity comprises p+ semiconductivity and wherein said second type semiconductivity comprises n+ semiconductivity.

6. The device as defined by claim 1 wherein said relatively narrow layers of first type semiconductivity of said first and second planar doped barrier regions comprise regions of semiconductor material doped with p+ dopant material wherein said outer layers of said second type semiconductivity comprise semiconductive material doped with n+ type dopant material.

7. The device as defined by claim 1 wherein said first and second planar doped barrier regions comprise n+-i-p+-i-n+ and i-p+-i-n+ type epilayer structures, respectively, and wherein said superlattice region comprises an i type epilayer structure contiguous with said structures of said planar doped barrier regions.

8. The device as defined by claim 7 wherein said device is formed of semiconductor compounds selected from Group III-V or II-IV compounds.

9. The device as defined by claim 8 and wherein said epilayer structures of said first and second planar doped barrier regions are formed from gallium arsenide and wherein said epilayer structure of said superlattice region is formed from both gallium arsenide and gallium aluminum arsenide.

10. The device as defined by claim 9 and additionally including a pair of ohmic contacts formed on the outer surface of the outer n+ layers of the first and second planar doped barrier regions to thereby provide a diode type of semiconductor device.

11. The device as defined by claim 10 and wherein the outer n+ layer of said n+-i-p+-i-n+ epilayer structure of said second planar doped barrier region includes a ring-shaped ohmic contact on a common outer surface with said superlattice region; said first doped barrier region being located in the center of said ring-shaped ohmic contact, and additionally including an ohmic contact on the outer surface of the n+ layer of said n+-i-p+-i-n+ first planar doped barrier region to thereby provide a diode type of semiconductor device.

12. The device as defined by claim 11 wherein said outer n+ layer of said n+ i-p+-i-n+ epilayer structure of said second planar doped barrier region comprises a layer having a relatively large thickness in relation to the remaining layers of said structure.

13. The device as defined by claim 1 wherein said outer layers of said first and second planar doped barrier region include a pair of ohmic contacts formed thereon to provide a diode type of semiconductor device.

* * * * *